(12) United States Patent
Yang et al.

(10) Patent No.: US 7,821,368 B1
(45) Date of Patent: Oct. 26, 2010

(54) THIN FILM TYPE COMMON MODE NOISE FILTER AND FABRICATION METHOD OF THE SAME

(75) Inventors: Ming Yi Yang, Yunlin County (TW); Zheng Yi Wang, Taipei County (TW); Ming Liang Hsieh, Tainan County (TW); Sheng Fu Su, Kaohsiung County (TW)

(73) Assignee: Inpaq Technology Co., Ltd., Hsinchu (TW)

( * ) Notice: Subject to any disclaimer, the term of this patent is extended or adjusted under 35 U.S.C. 154(b) by 0 days.

(21) Appl. No.: 12/453,904

(22) Filed: May 27, 2009

(51) Int. Cl.
*H01F 27/02* (2006.01)

(52) U.S. Cl. ........................................... 336/83

(58) Field of Classification Search ............... 336/65, 336/83, 200, 206–208, 232
See application file for complete search history.

(56) References Cited

U.S. PATENT DOCUMENTS

| | | | |
|---|---|---|---|
| 6,438,000 B1 * | 8/2002 | Okamoto et al. | 363/40 |
| 7,119,649 B2 * | 10/2006 | Shinkai et al. | 336/200 |
| 7,408,435 B2 * | 8/2008 | Nishikawa et al. | 336/200 |
| 7,508,292 B2 * | 3/2009 | Nishikawa et al. | 336/200 |
| 7,619,500 B1 * | 11/2009 | Nishikawa et al. | 336/200 |

* cited by examiner

*Primary Examiner*—Tuyen T. Nguyen
(74) *Attorney, Agent, or Firm*—Bacon & Thomas, PLLC (57) ABSTRACT

A thin film type common mode noise filter and its fabrication method are disclosed. There are several electric insulation layers, coil lead layers and main coil layers are formed on an insulation substrate by means of processes of Lithography, Physical Vapor Deposition, etching or other chemical process. After that the structure is covered with an electric insulation gluing layer and a magnetic material layer so as to form a thin film type common mode noise filter with a low production cost but an improved filtering characteristic of the common mode noise.

16 Claims, 7 Drawing Sheets

THIN FILM TYPE COMMON MODE NOISE FILTER AND FABRICATION METHOD OF THE SAME

BACKGROUND OF THE INVENTION

1. Field of the Invention

The present invention relates to a structure of thin film type common mode noise filter, and in particular, to a thin film coil formed on an insulation substrate with a less expensive cost yet is capable of eliminating high frequency common mode noise, and also to its fabrication method.

2. Description of the Related Art

In U.S. Pat. No. 7,145,427B2, there disclosed "Coil Component and Method of manufacturing the Same" in which a common mode noise filtering element forms a coil component on a magnetic substrate and then a cavity is caved by etching process on part of the substrate where no coil component occupies, after that the surface thereof is flattened by filling with the magnetic powder mixed with colloidal substance, and followed by the gluing process to bond with another magnetic material thereby completing the fabrication.

In the other U.S. Pat. No. 6,356,181 B1 and 6,618,929 B2, a layered common mode noise filter is disclosed. In both cases, a coil structure is established on a magnetic substrate and then covered by a magnetic substrate. The kernel of both cases lies in that a special wiring skill is employed for the coil to lessen the impedance of the differential signals.

However, all the aforementioned fabrication methods have the same shortcomings of complexity, time wasting and high cost in its fabrication. When using a magnetic material as the substrate, the ability to filter the common mode noise can not exceed −20 dB, and the manufacturing cost of the common mode noise filter never comes down under such situations.

The inventor of the present invention herein provides a common mode noise filter which is simply constructed and can be fabricated with a low cost, yet having common mode noise filtering characteristic of above −30 dB, and also the fabrication method thereof is to be elucidated.

SUMMARY OF THE INVENTION

The main object of the present invention is to provide a structure of thin film type common mode noise filter which is simply constructed and can be fabricated with a low cost, and the method of the fabrication thereof.

To achieve the above object, the present invention employs a substrate made of insulation material on which a thin film coil structure and insulation layers are established by spin coating, Lithography process, Physical Vapor Deposition, electroplating and thin film etching process successively, and finally a magnetic material layer is formed on the upper surface by gluing, spin coating or screen printing.

In the present invention, $Al_2O_3$, AlN, Glass or Quartz are used as an insulation substrate to achieve the low loss and high insulation properties. By doing so, the fabrication process can be simplified, the cost can be came down, but get a better filtering effect of common mode noises.

Further objects and purposes of the present invention will become apparent to persons from the detailed descriptions of the following embodiments.

DETAILED DESCRIPTION OF THE PREFERRED EMBODIMENTS

Figure 1:
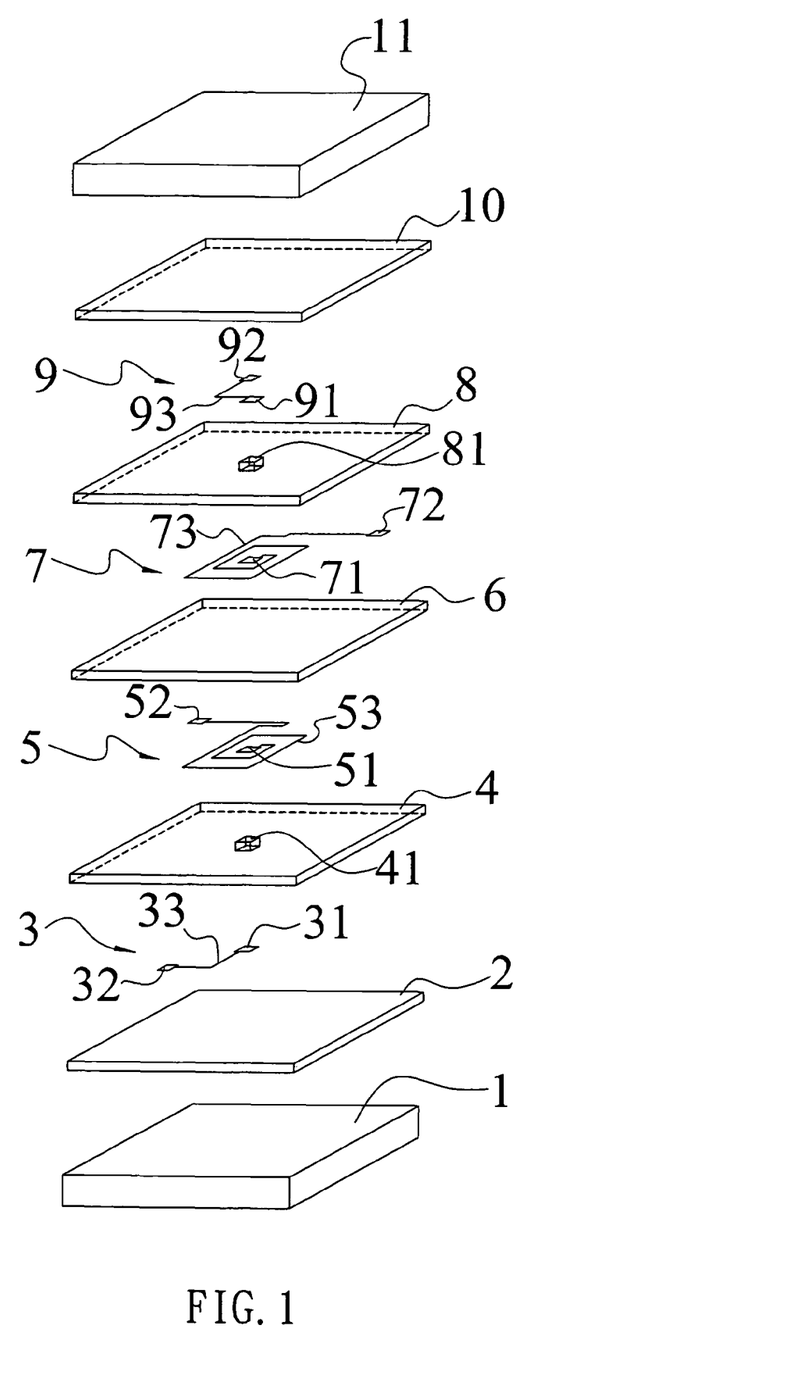
FIG. 1 is an exploded view of the thin film type common mode noise filter of the present invention.

Referring to FIG. 1, the thin film type common mode noise filter of the present invention comprises, from bottom to top: an insulation substrate 1, a first electric insulation layer 2, a first coil lead layer 3, a second electric insulation layer 4, a first main coil layer 5, a third electric insulation layer 6, a second main coil layer 7, a fourth electric insulation layer 8, a second coil lead layer 9, an insulation/gluing layer 10, and a magnetic material layer 11.

Figure 2A:
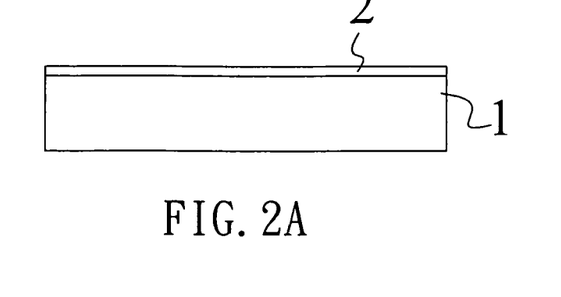
FIGS. 2A through 2J are a flow chart showing the fabrication process of the present invention.

The fabrication process of the aforesaid filter includes the following steps:

S1: As shown in FIG. 2A, selecting one of the $Al_2O_3$, AlN, glass or quartz substrate as the insulation substrate 1, and forming a first electric insulation layer 2 on its top surface, the material of the first electric insulation layer 2 is selected one of the polyimide, epoxy resin, Benzo CycloButene (BCB) or other high molecular polymers. The thickness of the spin coating layer can be used to adjust the impedance.

Figure 2B:
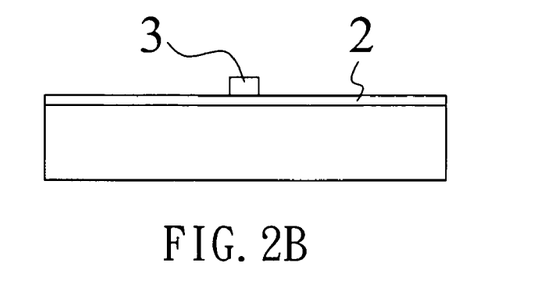

S2: As shown in FIG. 2B, forming a first coil lead layer 3 whose constructive material is selected one of Ag, Pd, Al, Cr, Ni, Ti, Au, Cu, Pt or their alloys. The first coil lead layer 3 includes a first electrode 31, a second electrode 32 and a conductor line 33 connected therebetween.

Figure 2C:
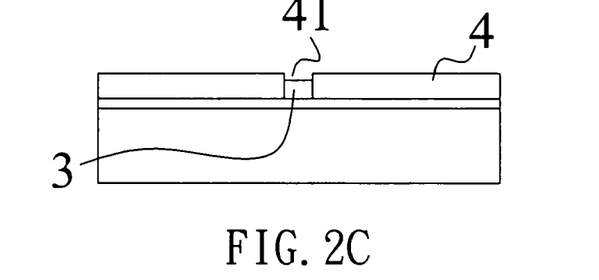

S3: As shown in FIG. 2C, forming a second electric insulation layer 4 on the first coil lead layer 3 by spin coating, and making a via hole 41 by Lithography or etching process, the position of the via hole 41 is aligned with the first electrode 31 of the first coil lead layer 3. The material of the second electric insulation layer 4 is also selected one of the polyimide, epoxy resin, BCB or other high molecular polymers.

Figure 2D:
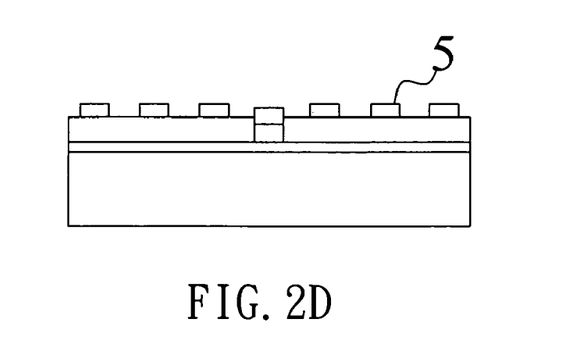

S4: As shown in FIG. 2D, forming a first main coil layer 5 on the second electric insulation layer 4 by thin film metal deposition, Lithography and electroplating alternately, the material of the first main coil layer 5 is also selected one of Ag, Pd, Al, Cr, Ni, Ti, Au, Cu, Pt, or their alloys. The first main coil layer 5 includes a first electrode 51, a second electrode 52 and a helical coil 53 connected therebetween. The first electrode 51 is connected with the first electrode 31 of the first coil lead layer 3 via the via hole 41 of the second electric insulation layer 4.

Figure 2E:
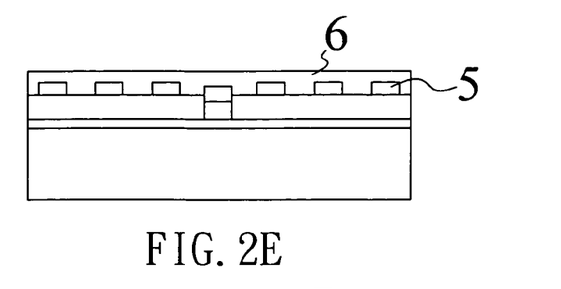

S5: As shown in FIG. 2E, forming a second electric insulation layer 6 on the first main coil layer 5 by spin coating, the material of the second electric insulation layer 6 is also selected one of the polyimide, epoxy resin, BCB or other high molecular polymers.

Figure 2F:
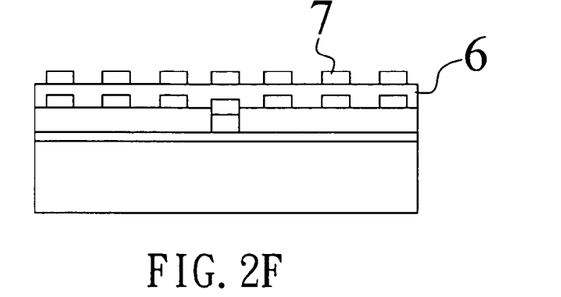

S6: As shown in FIG. 2F, forming a second main coil layer 7 on the second electric insulation layer 6 by thin film metal deposition, Lithography and electroplating, the material of the second main coil layer 7 is also selected one of Ag, Pd, Al, Cr, Ni, Ti, Au, Cu, Pt, or their alloys. The second main coil layer 7 includes a first electrode 71, a second electrode 72 and a helical coil 73 connected therebetween.

Figure 2G:
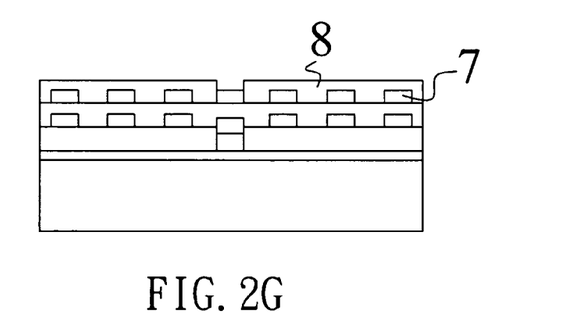

S7: As shown in FIG. 2G, forming a fourth electric insulation layer 8 on the second main coil layer 7 by spin coating, and caving a via hole 81 by Lithography or etching.

Figure 2H:
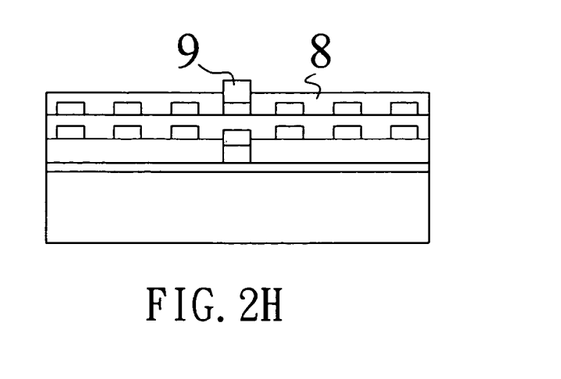

S8: As shown in FIG. 2H, forming a second coil lead layer 9 on the fourth electric insulation layer 8 by thin film metal deposition, Lithography and electroplating alternately, the material of the second coil lead layer 9 is one of Ag, Pd, Al, Cr, Ni, Ti, Au, Cu, Pt, or their alloys. The second coil lead layer 9 includes a first electrode 91, a second electrode 92 and a conductor line 93 connected therebetween. The first electrode 91 is connected with the first electrode 71 of the second main coil layer 7 via the via hole 81 of the fourth electric insulation layer 8.

Figure 2I:
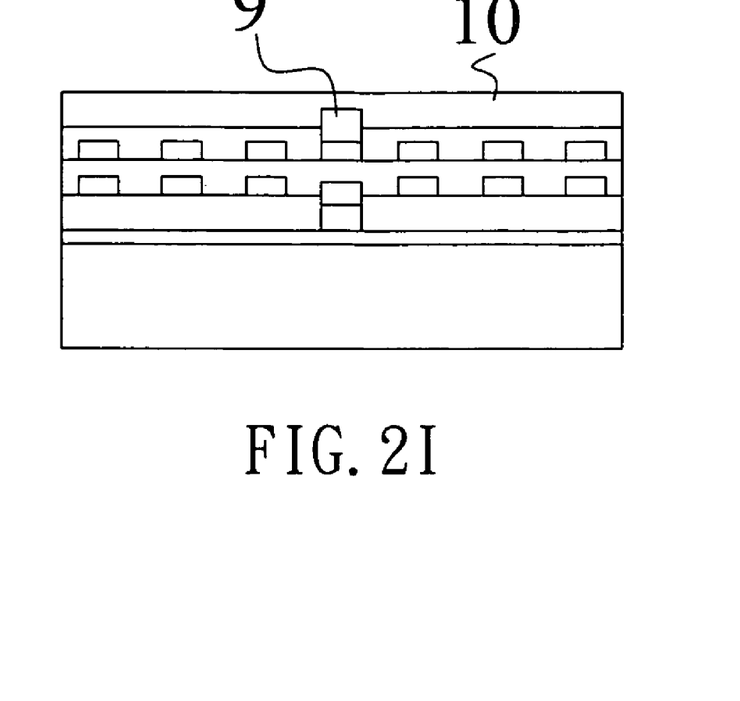

S9: As shown in FIG. 2I, forming an insulation/gluing layer 10 on the second coil lead layer 9 by spin coating.

Figure 2J:
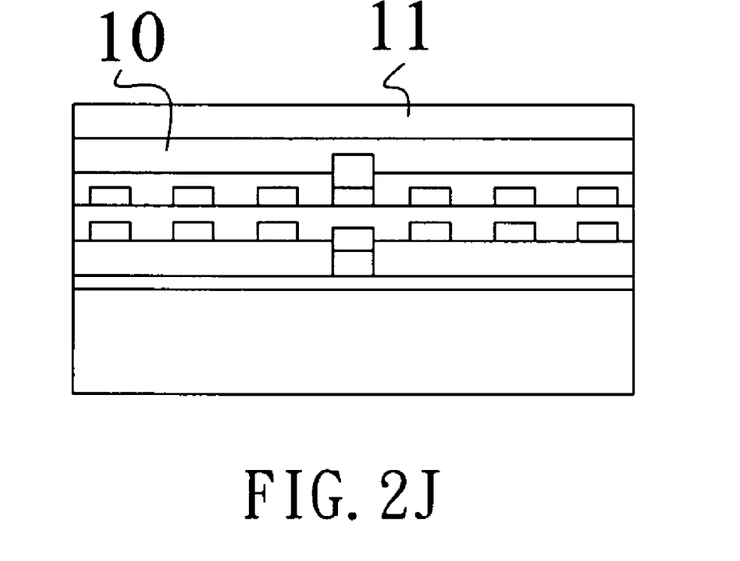

S10: Finally as shown in FIG. 2J, fabricating an upper lid using a magnetic material layer 11 by gluing, screen printing or spin coating. The magnetic material layer 11 may be a magnetic substrate or a colloidal substance mixed with the magnetic powder, where the colloidal substance may be one of the polyimide, epoxy resin, BCB or other high molecular polymers.

The aforesaid etching process may be either dry or wet etching process, RIE is preferable for dry etching, while chemical solution etching is adaptive for wet etching.

It is understood that in the present invention, the insulation layer and the coil structure are fabricated sequentially on a low energy loss and high insulation substrate, and a magnetic material layer is formed on the uppermost surface by gluing a magnetic substrate, or screen printing/spin coating a colloidal substance mixed with the magnetic powder, where the colloidal substance may be one of the polyimide, epoxy resin or other high molecular polymers.

From the above description, it can be clearly observed that the thin film type common mode noise filter of the present invention can be fabricated with simple steps yet with low production cost.

Figure 6:
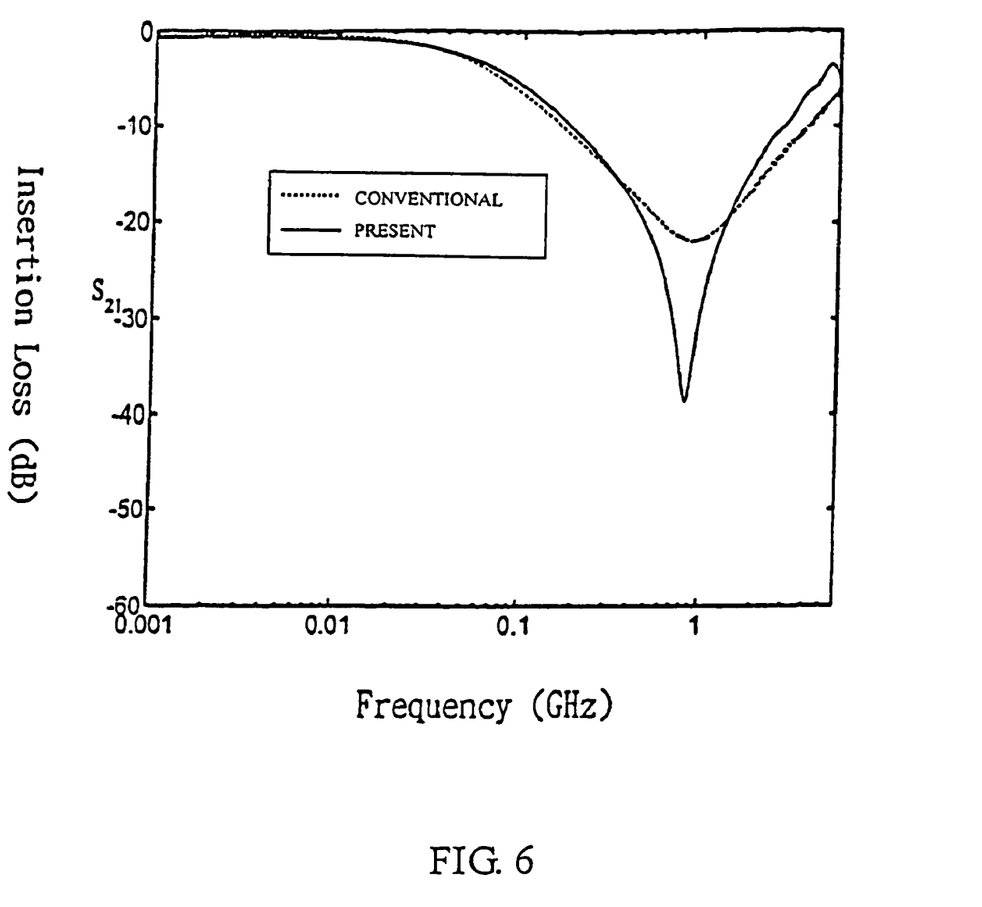
FIG. 6 is a graph comparing the electrical characteristic of the present invention with that of a conventional product.

Referring to FIG. 6, in the graph measured by the vector network analyzer, a higher common mode noise filtering effect can be achieved in comparison with the conventional one, wherein Scc21 attains below −30 dB.

Figure 3:
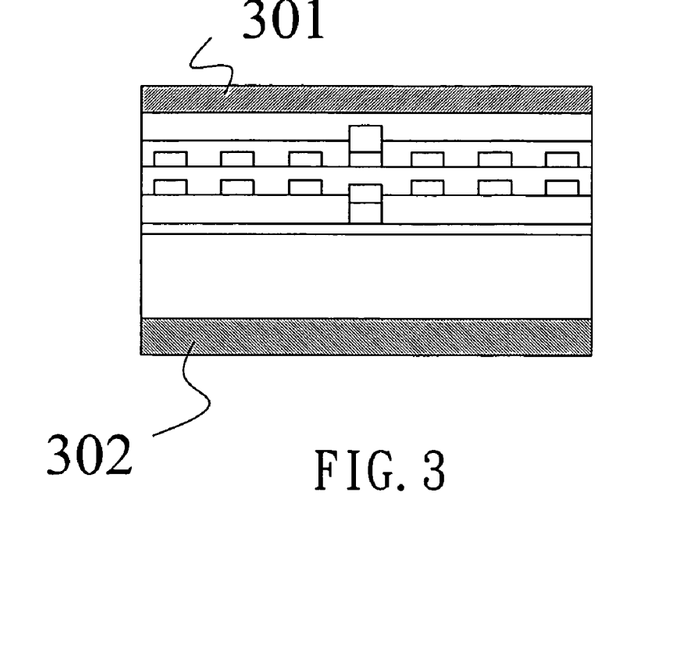
FIG. 3 is a second embodiment of the present invention.
Figure 4:
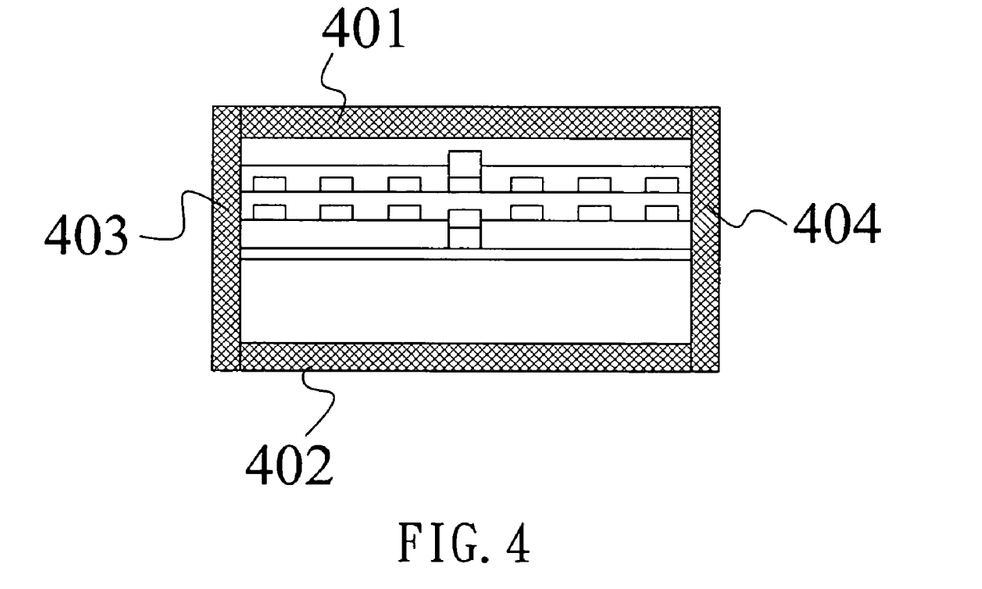
FIG. 4 is a third embodiment of the present invention.

Referring to FIG. 3, in the second embodiment, the magnetic material layers 301 and 302 are each formed on the uppermost and lowermost surface of the structure. In the third embodiment shown in FIG. 4, the magnetic material layers 401. 402, 403, 404 can respectively be formed on the uppermost, lowermost, left and right surfaces.

Figure 5:
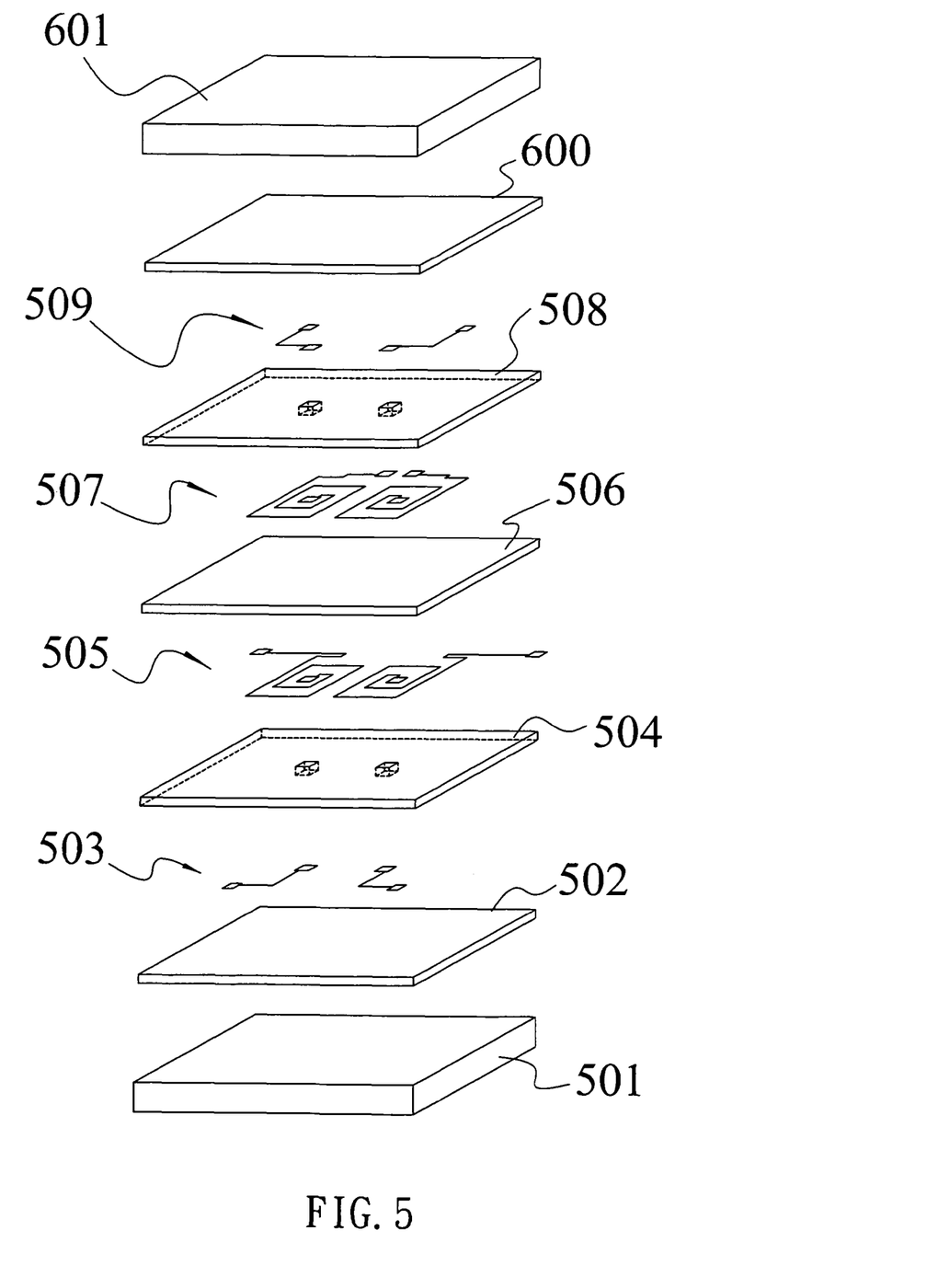
FIG. 5 is a fourth embodiment of the present invention.

Referring to FIG. 5, in the fourth embodiment, the coil lead layers and the main coil layers are formed in pairs according to the requirements of the electronic products which the filter of the present invention is applied. In this case, the structure comprises, from bottom to top: an insulation substrate 501, a first electric insulation layer 502, a first paired coil lead layers 503, a second electric insulation layer 504, a first paired main coil layers 505, a third electric insulation layer 506, a second paired main coil layers 507, a fourth electric insulation layer 508, a second paired coil lead layers 509, an insulation/gluing layer 600, and a magnetic material layer 601.

It is understood that the present invention is a high level technical creation, by no means simply utilizes conventional technology or knowledge known prior to the application for patent, or not easily be made by persons skilled in the prior arts, and the invention has neither been published or put to public use, nor displayed in an exhibition. Therefore the present invention is entitled for a patent.

Those who are skilled in the arts will readily perceive how to modify the invention. Therefore, the appended claims are to be construed to cover all equivalent structures which fall within the true scope and spirit of the invention.

What is claimed is:

1. A thin film type common mode noise filter comprising:
an insulation substrate;
a first electric insulation layer formed on said insulation substrate;
a first coil lead layer formed on said first electric insulation layer, wherein said first coil lead layer includes a first electrode and a second electrode, and a conductor line connected therebetween;
a second electric insulation layer having a via hole formed on said first coil lead layer;
a first main coil layer formed on said second electric insulation layer, wherein said first main coil layer includes a first electrode and a second electrode, and a helical coil connected therebetween, moreover, said first electrode is connected to said first electrode of said first coil lead layer via said via hole of said second electric insulation layer;
a third electric insulation layer formed on said first, main coil layer;
a second main coil layer formed on said third electric insulation layer; wherein said second main coil layer includes a first electrode and a second electrode, and a helical coil connected therebetween;
a fourth electric insulation layer formed on said second main coil layer, which has a via hole;
a second coil lead layer formed on said fourth electric insulation layer; wherein said second coil lead layer includes a first electrode and a second electrode, and a conductor line connected therebetween, and said first electrode is connected to said first electrode of said second main coil layer via said via hole of said fourth electric insulation layer;
an electric insulation gluing layer formed on said second coil lead layer; and
a magnetic material layer formed on said electric insulation gluing layer.

2. The noise filter according to claim 1, wherein said insulation substrate is one of the material of $Al_2O_3$, AlN, glass, quartz or any other ceramic materials.

3. The noise filter according to claim 1, wherein said electric insulation layer includes at least one of the following materials: polyimide, epoxy resin, BCB, and other high molecular polymers.

4. The noise filter according to claim 1, wherein said coil lead layer includes at least one of the following materials: Ag, Pd, Al, Cr, Ni, Ti, Au, Cu, Pt or their alloys.

5. The noise filter according to claim 1, wherein said magnetic material layer is a magnetic substrate or a colloid mixed with magnetic powder.

6. The noise filter according to claim 5, wherein said colloid is a mixture of magnetic powder and at least one of the polyimide, epoxy resin, BCB and other high molecular polymers.

7. The noise filter according to claim 5, wherein the thickness of said colloid layer can be adjusted to change the common mode impedance.

8. The noise filter according to claim 1, wherein said magnetic material layer is covered on the upper, lower surfaces or surfaces of the structure where no terminal electrodes are formed.

9. A method of fabricating a thin film type common mode noise filter comprising the following steps:
preparing an insulation substrate;
forming a first electric insulation layer by spin coating on the upper surface of said insulation substrate;

forming a first coil lead layer, including a first electrode, a second electrode and a conductor line connected therebetween, on the upper surface of said first electric insulation layer;

forming a second electric insulation layer having a via hole on said first coil lead layer by spin coating;

forming a first main coil layer, including a first electrode, a second electrode and a helical coil connected therebetween, on said second electric insulation layer;

forming a third electric insulation layer on said first main coil layer;

forming a second main coil layer, including a first electrode, a second electrode and a helical coil connected therebetween, on said third electric insulation layer;

forming a fourth electric insulation layer having a via hole on said second main coil layer;

forming a second coil lead layer, including a first electrode, a second electrode and a conductor line connected therebetween, on said fourth electric insulation layer;

forming an insulation/gluing layer on said second coil lead layers; and forming a magnetic material layer on said insulation/gluing layer.

10. The method according to claim 9, wherein said insulation substrate is one of the material of $Al_2O_3$, AlN, glass, quartz or any other ceramic materials.

11. The method according to claim 9, wherein said electric insulation layer includes at least one of the following materials: polyimide, epoxy resin, BCB and other high molecular polymers.

12. The method according to claim 9, wherein said main coil layer and said coil lead layer include at least one of the following materials: Ag, Pd, Al, Cr, Ni, Ti, Au, Cu, Pt or their alloys.

13. The method according to claim 9, wherein said main coil layer and coil lead layer are formed by process of Lithography, thin film metal deposition, electroplating and etching alternately.

14. The method according to claim 9, wherein said magnetic material layer is magnetic substrate or a colloid mixed with magnetic powder, and said colloid is a mixture of magnetic powder and material selected at least one of polyimide, epoxy resin, BCB and other high molecular polymers.

15. The method according to claim 9, wherein said via hole in said electric insulation layer is formed by Lithography process or etching process.

16. The method according to claim 15, wherein either dry etching or wet etching is permissible in said etching process, RIE process is applicable for dry etching, and a chemical solution is usable as an etchant for wet etching.

* * * * *